US006466495B2

(12) United States Patent
Rieger

(10) Patent No.: US 6,466,495 B2
(45) Date of Patent: Oct. 15, 2002

(54) ELECTRONIC CIRCUIT, TEST-APPARATUS ASSEMBLY, AND METHOD FOR OUTPUTTING A DATA ITEM

(75) Inventor: Martin Rieger, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/922,476

(22) Filed: Aug. 3, 2001

(65) Prior Publication Data

US 2002/0015343 A1 Feb. 7, 2002

(30) Foreign Application Priority Data

Aug. 3, 2000 (DE) .......................................... 100 37 988

(51) Int. Cl.$^7$ ................................................ G11C 7/00
(52) U.S. Cl. ....................................... 365/200; 365/201
(58) Field of Search .................................. 365/200, 201

(56) References Cited

U.S. PATENT DOCUMENTS

| | | | | |
|---|---|---|---|---|
| 5,469,390 A | * | 11/1995 | Sasaki et al. ................ | 365/200 |
| 5,841,709 A | | 11/1998 | McClure ..................... | 365/200 |
| 5,867,504 A | | 2/1999 | Pascucci ..................... | 714/711 |
| 5,995,424 A | | 11/1999 | Lawrence et al. ........... | 365/201 |
| 6,115,828 A | * | 9/2000 | Tsutsumi et al. ............ | 365/200 |
| 6,208,570 B1 | * | 3/2001 | Brown et al. ................ | 365/201 |
| 6,310,807 B1 | * | 10/2001 | Ooishi et al. ................ | 365/200 |
| 6,324,106 B2 | * | 11/2001 | Urakawa ..................... | 365/200 |

* cited by examiner

Primary Examiner—Trong Phan
(74) Attorney, Agent, or Firm—Laurence A. Greenberg; Werner H. Stemer; Ralph E. Locher

(57) ABSTRACT

Electronic circuits test memory matrices that have address inputs, data outputs and a memory matrix. The memory spaces in the memory matrix can be addressed via the address inputs, and output a data item via the data outputs. The circuit also has an output circuit, which connects to at least one of the address inputs, to the memory matrix, and to the data outputs. The output circuit outputs a data item to different data outputs, depending on its address. This circuit can be operated in an apparatus for testing the function of a memory matrix, with the circuit connecting the test apparatus and a memory matrix to one another such that the outputs of the memory matrix are produced at the data inputs of the circuit, and the data outputs together with the further data output of the circuit are applied to inputs of the test apparatus. The memory matrix has a main cell array and a redundant memory cell area, with the main cell array being tested in the first operating mode, and the redundant memory cell area being tested in the second operating mode.

19 Claims, 1 Drawing Sheet

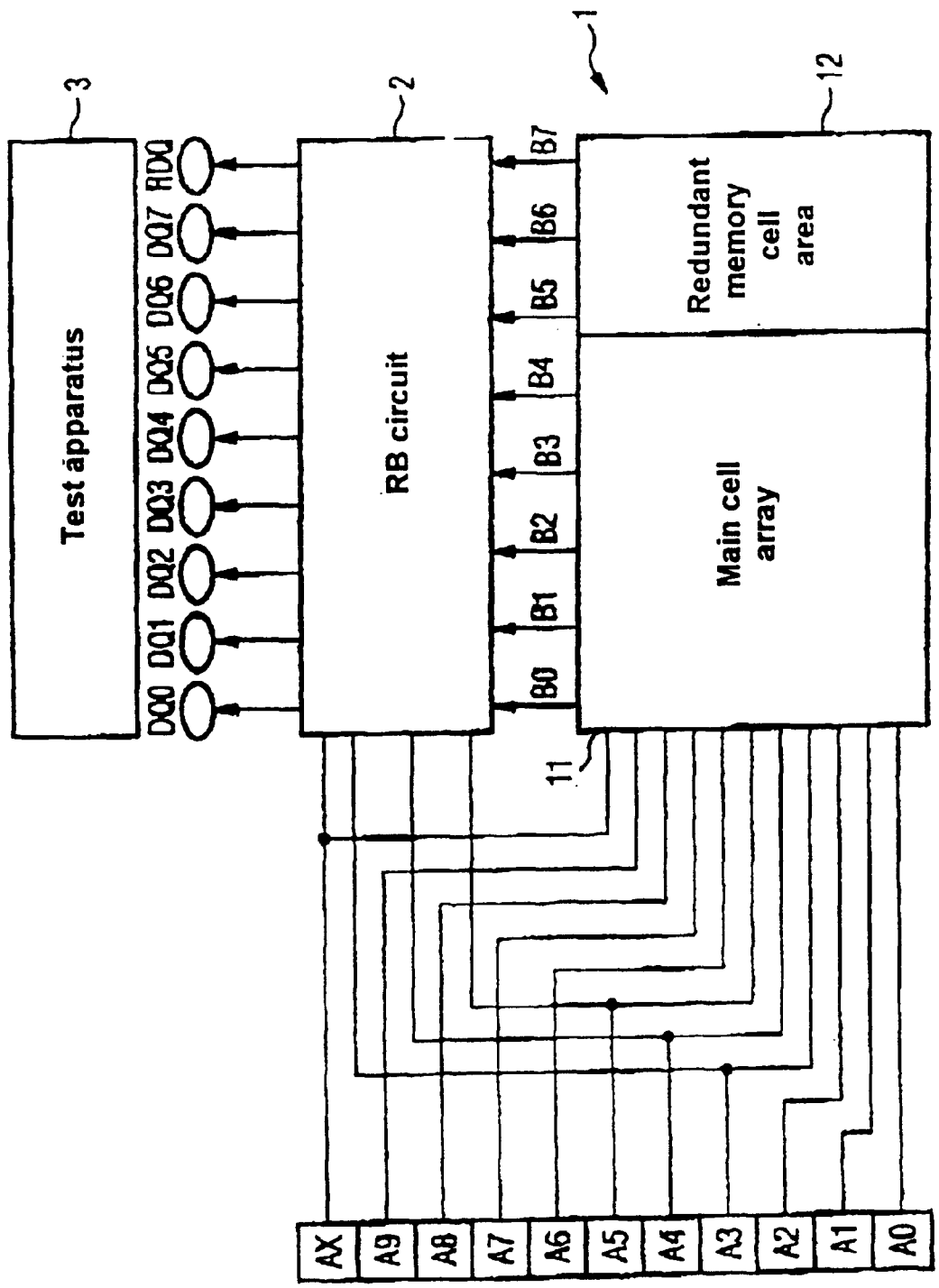

ELECTRONIC CIRCUIT, TEST-APPARATUS ASSEMBLY, AND METHOD FOR OUTPUTTING A DATA ITEM

BACKGROUND OF THE INVENTION

1. Field of the Invention

The invention relates to an apparatus and a method for testing semiconductor memories. It relates in particular to an apparatus for testing semiconductor memories having a main cell array and having a redundant memory cell area, using a conventional test apparatus.

Test apparatuses often have their own fault memory for storing fault maps. Such a fault memory is expensive and can only ever be enlarged up to a maximum size. In turn, this limits the size and number of semiconductor memories that can be tested in parallel. The fault memory is permanently connected to specific tester inputs, in many commercial test systems.

At the same time, it is normal for the tester to be equipped with a number of inputs per chip. This number is a multiple of nine in order to allow testing of chips with a parity bit for each byte. These inputs are generally unused for the many chip types without such a parity bit.

If, as stated above, fault memory capacity is permanently connected to these inputs, it is desirable to make this fault memory usable despite this, in order to maximize the number of chips to be tested at the same time, or in order to save the procurement costs of the fault memory, which is generally in the form of high-speed SRAMs.

In addition to the main cell array, semiconductor memories normally also have a redundant memory cell area. This redundant memory cell area allows replacement of faulty memory cell areas. The replacement process is accomplished by using a laser to cut through specific fusible wires, called fuses, on the chip after testing. In consequence, a segment in which a faulty cell is located is disconnected and is replaced by a serviceable segment in the redundant memory cell area. When testing semiconductor memories, ensuring that a faulty segment in the main cell array is not replaced by a faulty segment in the redundant memory cell area is necessary. This necessitates the testing of the cells in the redundant memory cell area as well.

The size of the redundant memory cell area is generally a few percent of the main cell array. The fault memory in modern conventional test systems is, however, often configurable only in powers of two (2) per input. So, whenever the main cell array itself already fills the entire fault memory available, checking the relatively small number of redundant cells becomes necessary. This means, when using conventional methods, the test parallelity must be halved or, provided this is still possible, the tester needs to be upgraded with twice the fault memory, which is expensive.

SUMMARY OF THE INVENTION

It is accordingly an object of the invention to provide an electronic circuit, test-apparatus assembly, and method for outputting a data item that overcomes the hereinaforementioned disadvantages of the heretofore-known devices of this general type and that tests the redundant memory cell area in semiconductor memories with a minimal tester memory.

With the foregoing and other objects in view, there is provided, in accordance with the invention, an electronic circuit for outputting contents of a memory matrix to a test apparatus. The electronic circuit includes a memory matrix having memory spaces each with an address storing an addressed data item. The addresses when stated allows the respective addressed data item to be read. Data outputs can connect to a test apparatus and output addressed data items. The electronic circuit also includes a plurality of address inputs. At least one of the address inputs specifies data outputs depending on the address of the addressed data item. An output circuit connects to at least one of the address inputs and to the data outputs, and to the memory matrix. The output circuit reads addressed data items stored in the memory matrix and outputs the read addressed data items to the specified data outputs.

With the objects of the invention in view, there is also provided an assembly for testing a memory matrix having a circuit including a memory matrix having memory spaces, each with an address storing an addressed data item. The addresses when stated allow the respective addressed data item to be read. Data outputs connect to a test apparatus and output addressed data items. The assembly also includes a plurality of address inputs. At least one of the address inputs specifies data outputs depending on the address of the addressed data item. An output circuit connects to at least one of the address inputs and to the data outputs, and to the memory matrix, reads addressed data items stored in the memory matrix, and outputs the read addressed data items to the specified data outputs. The apparatus includes a test apparatus having inputs for connecting to the data outputs of the circuit while the memory matrix outputs of the memory matrix are applied to data inputs of the circuit.

With the objects of the invention in view, there is also provided a method for outputting a data item. The first step of the method is providing a data item stored in a memory space having a memory address in the memory matrix connected to the data outputs. The data outputs connect to a test apparatus having a parity bit input. The data item in the addressed memory space is output by stating the memory address of that memory space to connected data outputs. The next step is outputting the data item the data outputs or the parity bit input of the test apparatus, depending on the memory address.

The electronic circuit according to the invention is suitable for outputting contents of a memory matrix. The electronic circuit includes address inputs, data outputs, and a memory matrix. The memory matrix is a conventional semiconductor memory, and is configured such that the memory spaces in the memory matrix can be addressed via the address inputs of the memory matrix. The electronic circuit furthermore has an output circuit, which is connected to the memory matrix, in order to transfer data stored in the memory matrix, and via which a data item can be output at the data outputs of the electronic circuit. The output circuit is connected to at least one of the address inputs and to the data outputs, in which case the data outputs on the output circuit can be connected to a test apparatus, being order to test the memory matrix. The output circuit outputs a data item stored in the memory matrix to different data outputs, depending on its address, with the process of outputting the data item via the specific data outputs or outputs (DQ0–DQ7, RDQ) being controlled via one or more of the address inputs (A0–A9, Ax). When the main cell array is being tested, the output circuit then connects the outputs of the memory matrix to the test apparatus. The redundant memory cell area is tested via one or more specific, dedicated data outputs of the circuit, which are normally applied to parity bit inputs of the test apparatus. It is thus possible to save a considerable amount of the tester's own fault memory, or to increase the test parallelity for a given maximum fault memory size.

The electronic circuit can be provided such that the data inputs of the circuit can be produced bit-by-bit at the dedicated data output during testing of the redundant memory cell area. This production of the data inputs bit-by-bit can be controlled by a number of the address inputs. In consequence, the required size of the fault memory that is connected to the regular data inputs of the tester can be reduced. Instead, this can now be used for testing parity outputs of available memory space.

Furthermore, the invention can provide for the address inputs to have a specific address input that is used for addressing the redundant memory cell area and that signals to the circuit that it is intended to output the data to other data outputs. This minimizes the required number of address lines; as such, a specific address input is required in any case for addressing the respective memory cell area.

In one preferred embodiment, the memory matrix has no output for a parity bit. In consequence, no such parity bit is tested. As a result of which, memory space remaining in the test apparatus can be used by the apparatus of the invention of the instant application.

The dedicated data output of the circuit is preferably connected to a parity bit input of the test apparatus. The memory that is provided in the test apparatus for testing the parity bit can thus be used for testing the redundant memory cell area.

Providing for different address inputs than those used for addressing the redundant memory cell area to be used for the output at the dedicated data output is possible. This measure avoids address conflicts that would arise if both the redundant memory cell areas and the individual bits stored in them used the same addresses, or partially the same addresses.

The invention also provides for the abovementioned method for testing a memory matrix such that all the bits in the address contents of the redundant memory cell areas are output successively to the dedicated data output of the test apparatus.

Other features that are considered as characteristic for the invention are set forth in the appended claims.

Although the invention is illustrated and described herein as embodied in an electronic circuit, test-apparatus assembly, and method for outputting a data item, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The FIGURE of the drawing is a partial block and partial schematic diagram showing a circuit testing a memory matrix with a test apparatus.

DESCRIPTION OF THE PREFERRED EMBODIMENTS

Referring now to the single FIGURE of the drawing, there is shown a cell array 1 that is subdivided into a main cell array 11 and a redundant area 12. The main cell array 11 has 1024 word line addresses and 256 column addresses, and is addressed via the address bits A0 to A9. Furthermore, there are in each case eight further row and column addresses for the redundant area. An address in the redundant memory cell area 12 is addressed using the address bit AX. If AX is not activated, then the address bits A0 to A9 determine the addressed memory cell in the main cell array 11. If AX is active, the word line address bits A0 to A2 determine an address in the redundant memory cell area 12. The data stored in the cell array 1 can be output via bit outputs B0–B7.

A redundant bit circuit 2 (RB circuit) is connected to the 8-bit outputs B0–B7 from the cell array 1, and to the word line address bits A3–A5 and AX. The redundant bit circuit 2 has data outputs DQ0–DQ7, RDQ, which are connected to tester inputs of a tester apparatus 3. During testing, the stored data is read as test results. If the redundant bit circuit obtains the test results from the main cell array 11 via the outputs B0–B7 when the address bit AX is not activated, then it outputs the test results via the lines DQ0 to DQ7 to the test apparatus 3. RDQ is then preferably of the value "0" but also can assume the value "1", or can be switched such that its impedance is high.

When testing the redundant memory cell area 12, the contents of the memory cells located there are likewise passed on via the bit outputs B0–B7 to the redundant bit circuit 2. The word line address of the redundant memory cell area 12 in this case corresponds to the bits A0–A2. The address bit AX then indicates to the redundant bit circuit 2 that the values, which are now present at B0–B7, represent the contents of the redundant memory cell area 12. This now means that the redundant bit circuit applies a defined value, for example a logic "0" or "1", to the data outputs DQ0 to DQ7 and to the tester inputs, or that these inputs can be switched to high impedance. The word line address bits A3 to A5, which are likewise connected to the redundant bit circuit 2, are now used such that they indicate which bit in the test result from the cell array 1 is output at the output RDQ of the redundant bit circuit 2 to the parity bit input of the tester. Thus, when testing the redundant memory cell area 12, the test results are output bit-by-bit successively to the test apparatus 3 via the output RDQ. To this end, the values of 0 to 7, better "000" to "111" in binary notation, just need to be applied to the bits A3 to A5 in order to output a byte.

In this way, it is thus possible for the redundant bit circuit 2, referred to in general terms, to output parts of the contents or test results of a memory matrix in accordance with the normal procedure directly and in parallel to specific inputs of the tester, while other parts of the memory are transferred bit-by-bit via predetermined outputs of the redundant bit circuit 3 to one or more other tester inputs, for example a parity bit input. When using the circuit according to the invention and/or the method according to the invention, test memory is thus used which was unused in the past. This is particularly worthwhile when testing memories with cell arrays without a parity bit output since this results in greater tester parallelity, and it is possible to avoid highly costly enlargement of the fault memory.

This apparatus and this method also allow two memory matrices, which are organized on a 4-bit basis, to be tested without a parity bit. To this end, the redundant memory cell areas in the two memory matrices each produce their outputs, successively and bit-by-bit, to the parity bit input of the test apparatus.

The features of the invention, which are disclosed in the description above, in the claims and the drawing, may be significant to the implementation of the various embodiments of the invention both individually and in any combination.

I claim:

1. An electronic circuit for outputting contents of a memory matrix to a test apparatus, comprising:
   a memory matrix having memory spaces each with an address storing an addressed data item, said addresses when stated allowing a respective addressed data item to be read;
   data outputs for connecting to a test apparatus and outputting addressed data items;
   a plurality of address inputs, at least one of said address inputs specifying data outputs depending on the address of the addressed data item; and
   an output circuit connecting to said memory matrix and at least one of said address inputs and said data outputs, reading addressed data items stored in said memory matrix and outputting the read addressed data items to said specified data outputs.

2. The circuit according to claim 1, wherein the addressed data items are output bit-by-bit via said specified data output.

3. The circuit according to claim 1, wherein non-specified data outputs produce a defined value.

4. The circuit according to claim 3, wherein the defined value is a logic "0".

5. The circuit according to claim 3, wherein the defined value is a logic "1".

6. The circuit according to claim 1, wherein non-specified data outputs have a high impedance.

7. The circuit according to claim 1, wherein at least one of said address inputs defines the output via the data outputs.

8. A test-apparatus assembly for testing a memory matrix of a circuit, the memory matrix having memory spaces each with an address storing an addressed data item, the addresses when stated allowing a respective addressed data item to be read; data outputs for connecting to a test apparatus and outputting addressed data items; a plurality of address inputs, at least one of the address inputs specifying data outputs depending on the address of the addressed data item; and an output circuit connecting to at least one of the address inputs and to the data outputs, and to the memory matrix, reading addressed data items stored in the memory matrix and outputting the read addressed data items to the specified data outputs; the test-apparatus assembly comprising:
   a test apparatus having inputs for connecting to the data outputs of the output circuit while the memory matrix outputs of the memory matrix are applied to data inputs of the circuit.

9. The apparatus according to claim 8, wherein said test apparatus has a first operating mode and a second operating mode; in the first operating mode, said apparatus testing a main cell array of the memory matrix; in the second operating mode, said apparatus testing a redundant memory cell area of the memory matrix being tested.

10. The apparatus according to claim 8, wherein said test apparatus has more inputs than would be usable if the memory matrix were tested without the output circuit.

11. The apparatus according to claim 8, wherein the memory matrix has no output for a parity bit.

12. The apparatus according to claim 8, wherein said test apparatus includes a parity bit input.

13. The apparatus as claimed in claim 12, wherein said parity bit input of said test apparatus connects to at least one of the specified data outputs of the circuit.

14. The apparatus according to claim 9, wherein address inputs not addressing the redundant memory cell area control the addressed data items being output by at least one of the data outputs.

15. The apparatus according to claim 8, wherein the memory matrix has dynamic semiconductor memory elements.

16. A method for outputting a data item, which comprises:
   providing a data item stored in a memory space having a memory address in the memory matrix connected to the data outputs, the data outputs connected to a test apparatus having a parity bit input, the data item in the addressed memory space being output by stating the memory address of that memory space to connected data outputs; and outputting the data item to one of the data outputs and the parity bit input of the test apparatus, depending on the memory address.

17. The method according to claim 16, which further comprises outputting data items from predetermined memory addresses in serial form via at least one of the data outputs.

18. The method according to claim 16, which further comprises:
   testing a main cell array of the memory matrix in a first operating mode; and
   testing a redundant memory cell area in the memory matrix in a second operating mode.

19. The method according to claim 18, wherein the testing of the redundant memory cell area includes:
   outputting a respective bit defined by the memory address to at least one of the data outputs connected to the test apparatus; and repeating the outputting of a respective bit until all the bits have been applied to the one data output or to the number of data outputs.

* * * * *